United States Patent [19]

Kagata et al.

[11] Patent Number: 5,221,412
[45] Date of Patent: Jun. 22, 1993

[54] VAPOR-PHASE EPITAXIAL GROWTH PROCESS BY A HYDROGEN PRETREATMENT STEP FOLLOWED BY DECOMPOSITION OF DISILANE TO FORM MONOCRYSTALLINE SI FILM

[75] Inventors: Yoshikazu Kagata, Nagoya; Katsuyoshi Harada, Okazaki, both of Japan

[73] Assignee: Toagosei Chemical Industry Co., Ltd., Tokyo, Japan

[21] Appl. No.: 588,220

[22] Filed: Sep. 26, 1990

[30] Foreign Application Priority Data

Sep. 26, 1989 [JP] Japan .................. 1-249690
Sep. 26, 1989 [JP] Japan .................. 1-249691

[51] Int. Cl.$^5$ ............................ H01L 21/20
[52] U.S. Cl. ........................ 156/612; 156/613; 437/81; 437/946
[58] Field of Search ....... 156/610, 612, 613, DIG. 64; 437/81, 946; 148/DIG. 169

[56] References Cited

U.S. PATENT DOCUMENTS 4,834,831  5/1989  Nishizawa et al. ................ 156/611
4,966,861  10/1990 Mieno et al. ....................... 437/99
5,011,789  4/1991  Burns ................................. 437/81

FOREIGN PATENT DOCUMENTS 239812    10/1988  Japan .
2092896   4/1990   Japan .
2106922   4/1990   Japan .
1071412   2/1964   United Kingdom .
2218567   11/1989  United Kingdom .

OTHER PUBLICATIONS

Srinivasan, "Recent Advances in Silicon Epitaxy and Its Application to High Performance Integrated Circuits", Journal of Crystal Growth 70 (1984) pp. 201-217.
Wolf et al. *Silicon Processing for the VLSI Era*, Lattice Press p. 124 (1986).
IBM Technical Disclosures, bulletin, vol. 26, No. 3A, Aug. 1983, pp. 918-910.
Extended Abstracts of the 18th (1986 International) Conference on Solid State Devices and Materials, Tokyo 1986, pp. 49-52.
J. Electrochem. Soc., vol. 134, No. 9, Sep. 1987, pp. 2320-2323.
J. Electrochem. Soc., vol. 134, No. 6, Jun. 1987, pp. 1518-1523.

*Primary Examiner*—Olik Chaudhuri
*Assistant Examiner*—Ken Horton
*Attorney, Agent, or Firm*—Browdy and Neimark

[57] ABSTRACT

The present invention provides a process for the vapor-phase epitaxial growth of a Si single crystal film on a Si single crystal substrate using diluted disilane, in which the process is carried out at a linear speed of diluted disilane on the surface of the Si single crystal substrate is in the range of 5 to 100 cm/min. and, as desired, the substrate is subjected to the heat pretreatment in a hydrogen stream at a temperature of 1,000° C. or higher for a period of 30 minutes or longer before the epitaxial growth.

1 Claim, 2 Drawing Sheets

10μm

10μm

VAPOR-PHASE EPITAXIAL GROWTH PROCESS BY A HYDROGEN PRETREATMENT STEP FOLLOWED BY DECOMPOSITION OF DISILANE TO FORM MONOCRYSTALLINE SI FILM

BACKGROUND OF THE INVENTION

1. Field of the Invention

The present invention relates to a vapor-phase epitaxial growth process for producing a Si single crystal substrate having a Si single crystal film thereon, which is useful for making semiconductor integrated circuits, by epitaxially growing the Si single crystal film on the Si single crystal substrate.

2. Description of Related Art

In the production of semiconductor integrated circuits, the process for producing a Si single crystal substrate having a Si single crystal film by epitaxially growing the Si single crystal film on the Si single crystal substrate is one of some important processes.

This process has such a problem that since it is usually carried out at so high a temperature as 1,000° C. or higher, the autodoping and solid phase diffusion cause dopants in the Si single crystal substrate to penerate into the epitaxially grown Si single crystal film, and defects like slips are formed.

Various processes in which the crystal growth is carried out at a lower temperature to solve the problem above have been proposed.

In one of these processes, an easily decomposable gas is used as a raw material, and as such easily decomposable gas has been proposed, for example, disilane ($Si_2H_6$).

It is known that when disilane is used in the vapor-phase epitaxial growth, a crystal can be grown even at 700° C. under atmospheric pressure.

However, the Si single crystal film obtained by the vapor-phase epitaxial growth using disilane at 700° C. under atmospheric pressure still has more than $10^4/cm^2$ of faults and hence is industrially unsatisfactory and further the deposition rate or growing rate of the film is as low as 0.01 $\mu$m/min.

Furthermore, when the crystal growth is carried out at a lower temperature for the purpose of reducing the faults, the single crystal is hardly produced, and rather a polycrystal is produced. In order to avoid the production of such a polycrystal, a way such as growth with irradiation of an ultraviolet ray or growth under reduced pressure has been proposed, which way, however, requires complicated apparatuses. Thus, the way is unacceptable from an economical and technological point of view.

The inventors have conducted intensive researches for solving the problems as mentioned above, that is, inhibiting the generation of the stacking faults in the Si single crystal film, decrease of the film deposition rate and production of the polycrystal during the vapor-phase epitaxial growth of the Si single crystal film from disilane on the Si single crystal substrate at a low temperature.

SUMMARY OF THE INVENTION

The object of the present invention is to provide a process for the vapor-phase epitaxial growth of a Si single crystal film having a less amount of stacking faults and a less amount of polycrystals produced on a Si single crystal substrate, with disilane at a high growing rate.

The inventors have found that the problems as mentioned above can be solved by controlling the liner speed of allowing gaseous disilane to pass through on the Si single crystal substrate and further by subjecting the surface of the Si single crystal substrate to the heat treatment as mentioned below before the epitaxial growth.

BRIEF DESCRIPTION OF THE DRAWINGS

FIG. 3(*b*) is an optical microphotograph of the Si single crystal film obtained in Example 5.

FIG. 4(*b*) is a reflective electron diffraction pattern of the Si single crystal film obtained in Example 5.

DETAILED DESCRIPTION OF PREFERRED EMBODIMENTS

Figure 1:
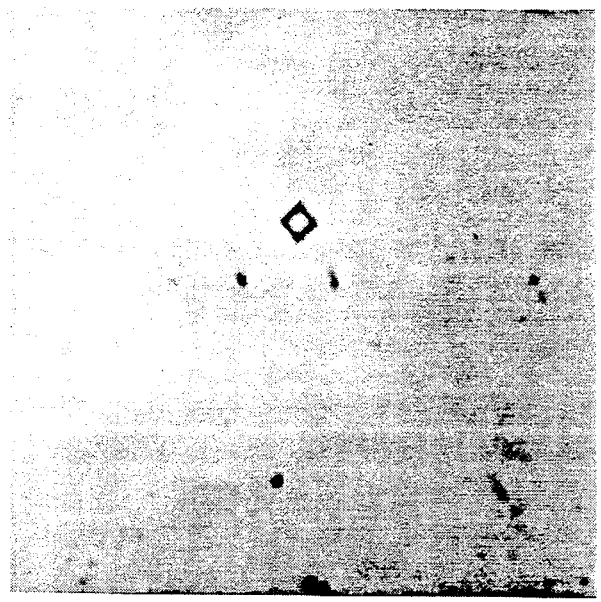
FIG. 1 is an optical micrograph of the Si single crystal film obtained in Example 1.

The process for the vapor-phase epitaxial growth of a Si single crystal film on a Si single crystal substrate using disilane, according to the present invention, is characterized in that the linear speed of a diluted disilane on the surface of the Si single substrate is in the range of 5 to 100 cm/min, and further characterized in that the Si single crystal substrate is one which has been subjected to heat treatment, as desired, at a temperature of 1,000° C. or higher for a period of 30 minutes or longer in a hydrogen stream.

Disilane used in the present invention is preferably of a high purity, and it is diluted with a diluent of an inert gas such as hydrogen, helium and argon.

The concentration of the diluted disilane may vary depending upon the deposition rate and is preferably in the range of 0.001 to 10 vol%, more preferably 0.001 to 1 vol%, especially 0.02 to 0.5 vol%.

As an apparatus for the epitaxial growth, there may be used a conventional one of, for example, a horizontal type, vertical type, barrel type and pancake type (upright type). The pancake type apparatus is preferred.

The single-crystal substrate on which the single crystal film is grown is preferably subjected to a heat pretreatment preferably at a temperature of 1,000° C. or higher, more preferably 1,050° to 1,400° C. for a period of 30 minutes or longer in a hydrogen stream.

If the heating temperature for the heat pretreatment of the Si single crystal substrate is lower than 1,000° C., smaller advantages than those expected can only be obtained when the temperature of growing the Si single crystal film on the Si single crystal substrate is adjusted to so low a temperature as 700° C. or lower, as desired by the present invention. If the heating temperature for the heat pretreatment is 1,400° C., there may be some inconveniences of the substrate being molten or damaged.

A heating method for the heat pretreatment of the Si single crystal substrate may be a conventional one such as rf (radio-frequency) heating and heating with an infrared-ray lamp.

The heating time for the heat pretreatment of the Si single crystal substrate is preferably in the range of 30 minutes or longer. There is no special upper limit in this range, but it is preferably shorter than 2 hours from an economical point of view.

If the heating time is shorter than 30 minutes, smaller advantages than those expected can only be obtained when the temperature of growing the Si single crystal film on the Si single crystal substrate is adjusted to so low a temperature as 700° C. or lower, as desired by the present invention.

The heat pretreatment is carried out in a hydrogen stream.

The Si single crystal substrate may be placed in a vapor-phase epitaxial growth apparatus in various directions, for example, in parallel to or perpendicular to the flow of the diluted disilane gas supplied, or in an intermediate direction between the parallel direction and the perpendicular direction (namely inlined to the flow). The directions other than the direction parallel to the flow of the diluted disilane gas preferred.

In accordance with the present invention, the diluted disilane gas is supplied to an epitaxial growth apparatus having a Si single crystal substrate placed therein and is decomposed in the apparatus to carry out the epitaxial growth of the Si single crystal film on the substrate. For this purpose, various CVD methods may be applied, but a thermal CVD method is preferred. The thermal CVD method is carried out with rf (radio-frequency) heating, infrared-ray lamp heating or resistance heating.

It is required to supply a disilane gas to an epitaxial growth apparatus at a linear supply speed of 5 to 100 cm/min. on the surface of the Si single crystal substrate. Only the supply of the disilane gas under these conditions can achieve the object of the present invention to improve the deposition rate of the Si single crystal film free of the faults.

If the linear supply speed of the disilane gas on the surface of the Si single crystal substrate is less than 5 cm/min., the satisfactory deposition rate can hardly be obtained. If it is more than 100 cm/min., there are generated faults in the resulting single crystal film. Thus, the advantages desired by the present invention cannot be obtained outside the supply speed range above.

The temperature of the epitaxial crystal growth is in the range of about 800° C. to about 1,200° C., which is substantially the same as in the conventional method. Moreover, the heat pretreatment for the heating time as mentioned above makes the epitaxial crystal growth of the Si single crystal film possible even at a temperature of 700° C. or lower, for example, about 600 ° C. or 500° C., at which the Si single crystal growth is impossible with prior art methods.

According to the present invention, the specific linear supply speed and heat pretreatment make the growth of the Si single crystal film and the improvement of the deposition rate of the film even at 400° C. The range of 550° to 680° C. is practical.

The pressure for the epitaxial crystal growth in accordance with the present invention may be normal or reduced to about 50 Torr, but a pressure of 660 to 860 Torr near atmospheric pressure is preferred.

The present invention will be explained below in detail with reference to some examples.

EXAMPLE 1

An n-type (Sb-doped) Si single crystal substrate of 2" surface orientation (100) was placed in a SiC-coated carbon-made susceptor (support), which was set in a vertical cylindrical quartz-made tube. Hydrogen was allowed to pass through the tube under normal pressure at a rate of 1,500 cc/min. The Si substrate was heated with rf (radio-frequency) heating to 1,050° C. and maintained at this temperature for 10 minutes.

Thereafter, the substrate was cooled down to 700° C. and then a gas comprising hydrogen and disilane was allowed to pass through the tube at a flow rate of 1,500 cc/min. for hydrogen and 2 cc/min. for disilane for 60 minutes. The linear speed of disilane gas was 30 cm/min.

The resulting Si single crystal film was found to have a complete mirror surface. As a result of reflective electron diffraction analysis, Kikuchi line was seen to reveal that the resulting film was comprised of a perfect single crystal.

Figure 2:
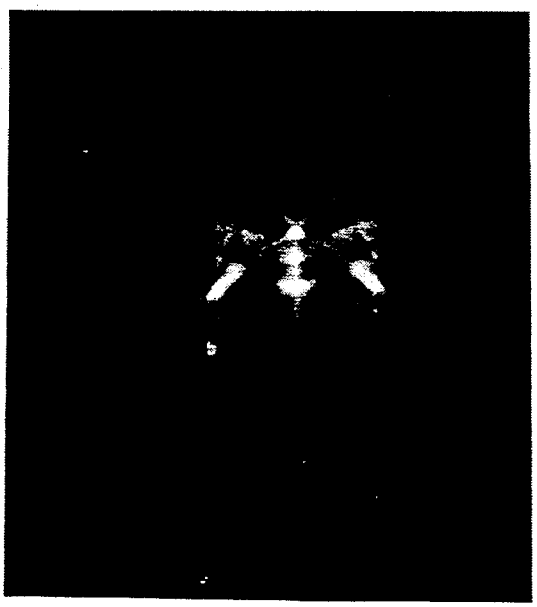
FIG. 2 is a reflective electron diffraction pattern of the crystal obtained in Example 1.

The resulting Si single crystal film was subjected to the Secco etching. This revealed that the film had so small an amount of faults such as stacking faults that there were substantially no problems in practical use. The optical microphotograph and reflective electron diffraction pattern of the Si single crystal film are shown in FIGS. 1 and 2, respectively.

EXAMPLE 2

The procedures of Example 1 were repeated, except that the temperature of the epitaxial growth was 900° C. and the flow rate of the disilane was 6 cc/min. (the linear speed of disilane gas was 30 cm/min.)

The resulting Si single crystal film was comprised of a perfect single crystal free of the faults. The deposition rate was as very high as 1.3 μm/min.

The epitaxial growth temperature was 1,050° C., the flow rate of disilane was 4 cc/min. and the linear speed of disilane was 6 cm/min., 20 cm/min. and 40 cm/min. The resulting Si single crystal films were also comprised of a perfect single crystal having few faults. The deposition rates of the films were 0.1, 0.18 and 0.83 μm/min., respectively.

EXAMPLE 3

A Si single crystal film was grown in the same manner as in Example 1, except that the heating time of the heat pretreatment of the Si single crystal substrate was 60 minutes and the epitaxial crystal growth was 650° C. (the linear speed of disilane gas was 30 cm/min.)

The deposited film had a complete mirror surface and the film thickness was 5,000 Å and the deposition rate was 0.0083 μm/min. As a result of reflective electron diffraction analysis, Kikuchi line was seen to reveal that the resulting film was comprised of a perfect single crystal. The Secco etching of the resulting film revealed that the resulting film had a less amount of faults such as stacking faults.

EXAMPLE 4

A Si single crystal film was grown in the same manner as in Example 3, except that the flow rate of disilane was 0.1 cc/min. (the linear speed of disilane gas was 30 cm/min.) The deposition rate of the film was 0.0006 μm/min.

Figure 3A:
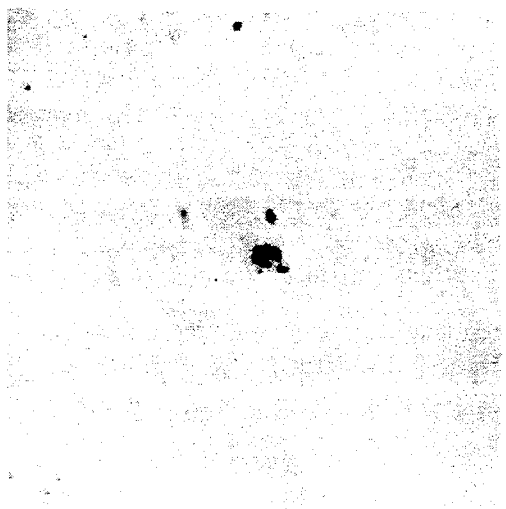
FIG. 3(*a*) is an optical microphotograph of the Si single crystal film obtained in Example 4.
Figure 4A:
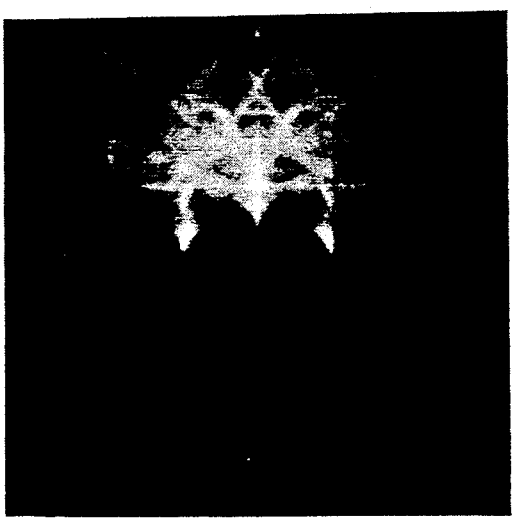
FIG. 4(*a*) is a reflective electron diffraction pattern of the Si single crystal film obtained in Example 4.

The deposited Si single crystal film had a complete mirror surface. The optical microphotograph and the reflective electron diffraction pattern of the Si single crystal film are shown in FIGS. 3(a) and 4(a), respectively. Kikuchi line was seen to reveal that the resulting film was comprised of a perfect single crystal. The Secco etching of the film revealed that the film had no faults.

EXAMPLE 5

A Si single crystal film was grown in the same manner as in Example 4, except that the heating time of the heat pretreatment of the Si single crystal substrate was 10 minutes. (The linear speed of disilane gas was 30 cm/min.)

Figure 3B:
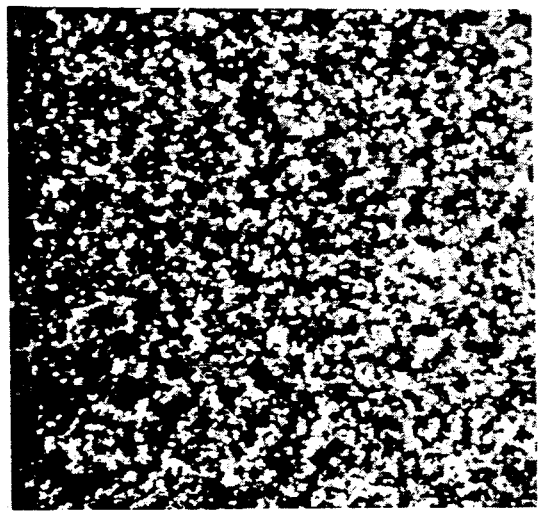
Figure 4B:
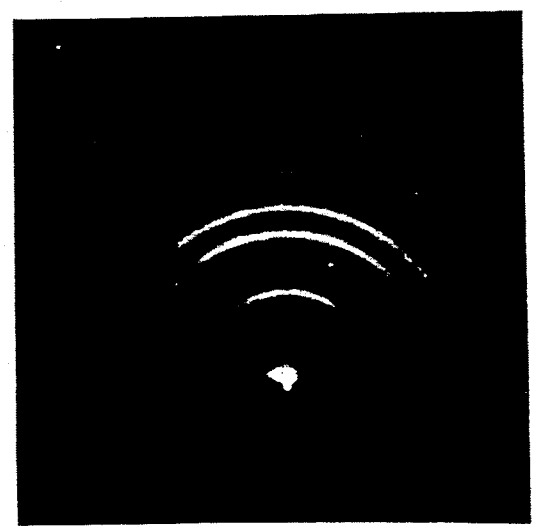

The deposition rate of the film was 0.0006 μm/min., but since the heating time was as short as 10 minutes, the optical microphotograph of the resulting Si single crystal film was as shown in FIG. 3(b) and the reflective electron diffraction pattern of the film was as shown in FIG. 4(b). Many crystal boundaries and a ring pattern were seen in FIGS. 3(b) and 4(b), respectively.

The present invention is featured in that a linear speed of diluted disilane in contact with the surface of a Si single crystal substrate is 5 to 100 cm/min. and that the disilane is allowed to contact the surface of the Si single crystal substrate after the substrate has been subjected to the heat pretreatment in a hydrogen stream at a temperature of 1,000° C. or higher for a period of 30 minutes or longer. In accordance with the present invention, there can be obtained the advantages that the Si single crystal film is substantially free of faults such as stacking faults, i.e., in a highly perfect crystal form and further can be deposited on a Si single crystal substrate at a relatively low temperature and a high deposition rate, and in addition, without using any complicated apparatus. Thus, the epitaxial growth process of the present invention is industrially very useful.

What is claimed is:

1. A process for the vapor-phase epitaxial growth of a Si single crystal film on a Si single crystal substrate comprising:

subjecting a substrate to a heat pretreatment in a hydrogen stream at a temperature of 1,000° C. or higher for a period of 30 minutes or longer and the pressure is in the range of about 660 Torr to about 860 Torr and, adding diluted disilane over the surface of the substrate at a linear flow rate in the range of about 5 to about 100 cm/min and at a pressure in the range of about 660 Torr to about 860 Torr to cause epitaxial growth of a Si single crystal at a deposition rate of about 1.3 μm/min on the substrate.

* * * * *